(12) United States Patent
Kim et al.

(10) Patent No.: US 6,949,429 B2
(45) Date of Patent: Sep. 27, 2005

(54) SEMICONDUCTOR MEMORY DEVICE AND METHOD FOR MANUFACTURING THE SAME

(75) Inventors: Ki-Nam Kim, Yongin (KR); Byung-Jun Park, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/796,098

(22) Filed: Mar. 10, 2004

(65) Prior Publication Data

US 2004/0173831 A1 Sep. 9, 2004

Related U.S. Application Data

(62) Division of application No. 10/246,392, filed on Sep. 19, 2002, now Pat. No. 6,727,542.

(30) Foreign Application Priority Data

Jan. 16, 2002 (KR) .............................. 10-2002-0002509

(51) Int. Cl.$^7$ .......................................... H01L 21/8242
(52) U.S. Cl. ...................................... 438/253; 438/239
(58) Field of Search ......................................... 438/253

(56) References Cited

U.S. PATENT DOCUMENTS 6,562,679 B2    5/2003   Lee et al.

Primary Examiner—Douglas A. Wille
(74) Attorney, Agent, or Firm—Volentine Francos & Whitt, PLLC

(57) ABSTRACT

A semiconductor memory device and a method for manufacturing the same are provided. The semiconductor memory device includes an oxide layer for isolating individual devices which define device areas so that a cell area and a peripheral circuit area are separated from each other on a semiconductor substrate, a plurality of MOS transistors, which are comprised of source areas, drain areas, and gates that are formed in the cell area and the peripheral circuit area, a bit line, which is formed on the plurality of MOS transistors and is electrically connected to the MOS transistor, a stack-shaped capacitor, which is comprised of a first electrode, a dielectric layer, and a second electrode between which the MOS transistors and the bit line in the cell area is interposed, a guard-ring pattern, which are interposed between the cell area and the peripheral circuit area, surrounds the cell area and is apart from the peripheral circuit area, and a contact fill for plate electrode, which is formed in the guard-ring pattern and is in contact with the second electrode that is formed on the internal sidewall and the bottom of the guard-ring pattern. The guard-ring pattern is formed in a boundary between the cell area and the peripheral circuit area while surrounding the cell area, and thereby step caused by manufacture of the stack-shaped capacitor are removed during a manufacturing process, and the contact fill for plate electrode is formed in the guard-ring pattern, and thereby the ground resistance of the capacitor is reduced, and the electrical characteristics of the memory device are improved.

32 Claims, 11 Drawing Sheets

SEMICONDUCTOR MEMORY DEVICE AND METHOD FOR MANUFACTURING THE SAME

CROSS REFERENCES TO RELATED APPLICATIONS

This application is a divisional of U.S. patent application Ser. No. 10/246,392 filed on 19 Sep. 2002 now U.S. Pat. No. 6,727,542, and claims priority under 35 U.S.C. §119 from Korean Patent Application No. 2002-2509, filed on 16 Jan. 2002, the entirety of each of which is hereby incorporated by reference as if fully set forth herein.

BACKGROUND

1. Field of the Invention

The present invention relates to a semiconductor memory device and method for manufacturing the same, and more particularly, to a dynamic random access memory (DRAM) having a stack-shaped capacitor and a method for manufacturing the same.

2. Description of the Related Art

A dynamic random access memory (DRAM) among semiconductor memory devices is comprised of one transistor and one capacitor. Thus, in order to serve as a memory device, the DRAM must have sufficient capacitance. There is no problem when the design rule of the memory device is wide. However, as the memory device becomes highly integrated, its design rule becomes extremely dense and an area for each memory device becomes narrower, and thus, area per cell also decreases. A stack-shaped capacitor has been developed to obtain sufficient capacitance as the area becomes narrower. The stack-shaped capacitor can increase a surface area by forming an electrode with high depth even though the occupied area of the capacitor decreases. Thus the required capacitance of the capacitor can be obtained even though the design rule of the memory device becomes finer. However, in the stack-shaped capacitor, when the stack-shaped capacitor forms a storage node, a step between the cell area and a peripheral area becomes very severe. As a result, a metal interconnection process cannot be performed well due to an extreme pattern-thinning phenomenon caused by diffraction and irregular reflection of light, which is exposed due to a high step between a cell area and the peripheral area during a subsequent photolithographic process for metal interconnections in a case where a predetermined planarization process is not performed.

Thus, in a conventional planarization process between the cell area and the peripheral area, a very thick interlayer dielectric (ILD) film is formed on the surface of a semiconductor substrate after a capacitor process is completed. The cell area having a high step is opened after a predetermined photolithographic process, and then, the ILD film in the cell area is etched to a predetermined thickness through dry etching, and thereby removed. Then, the step between the cell area and the peripheral area is slightly decreased. The thick ILD film is again formed on the surface of the semiconductor substrate and is polished and removed and thereby planarized to enable the metal interconnection process on the entire surface of the semiconductor substrate through chemical mechanical polishing (CMP).

However, the photolithographic process for opening the cell area and a dry etching process is added to the conventional planarization process between the cell area and the peripheral area, and an additional planarization process using CMP is accompanied by a subsequent process, thus increasing the number of processes. Moreover, the photolithographic process and the CMP process are included, and thus the reliability of production is reduced, and the period of a manufacturing process becomes longer, and costs increase.

SUMMARY

To solve the above problems, it is an object of the present invention to provide a semiconductor memory device and a method for manufacturing the same in which manufacturing processes are simplified, and a wide contact area is formed on a plate electrode for serving as the ground electrode of a capacitor so that a step between a cell area of a semiconductor chip and a peripheral area formed by a capacitor formed in the cell area is effectively decreased, thereby greatly reducing ground resistance, thus improving the electric characteristics of a memory device.

Accordingly, to achieve the above object, according to one embodiment, there is provided a semiconductor memory device. The semiconductor memory device includes an oxide layer for isolating individual devices which define device areas so that a cell area and a peripheral circuit area are separated from each other on a semiconductor substrate. The semiconductor memory device also includes: a plurality of MOS transistors, which are comprised of source areas, drain areas, and gates that are formed in the cell area and the peripheral circuit area; a bit line, which is formed on the plurality of MOS transistors and is electrically connected to the MOS transistors; a stack-shaped capacitor, which is comprised of a first electrode, a dielectric layer, and a second electrode between which the MOS transistors and the bit line in the cell area are interposed; a guard-ring pattern, which is interposed between the cell area and the peripheral circuit area; surrounds the cell area and is apart from the peripheral circuit area, and a contact fill for a plate electrode, which is formed in the guard-ring pattern and is in contact with the second electrode that is formed on the internal sidewall and the bottom of the guard-ring pattern.

The first electrode of the stack-shaped capacitor is electrically connected to the source areas and has a hollow cylindrical shape so that the area of a capacitor per area is increased, and capacitance is maximized. The first electrode is conductive polycrystalline silicon (polysilicon) such as an impurity-doped polycrystalline silicon, and further includes a barrier layer such as platinum (Pt), RuO, Rb, and RbO. The dielectric layer may be a combination layer of a silicon oxide layer and a silicon nitride layer, but is preferably formed of a high dielectric material that is at least one selected from $Ta_2O_5$, PZT, PZLT, BST, and $Al_2O_3$, such that the capacitance of the capacitor is increased for a given area.

The second electrode is formed in a block form to overlap a predetermined region adjacent to the peripheral circuit area including the entire cell area, and the second electrode is conductive polysilicon, such as an impurity-doped polysilicon, and the second electrode further includes a barrier layer, thereby preventing impurity atoms constituting a high dielectric layer from penetrating into junctions that are formed on a lower portion of the semiconductor memory device and thereby deteriorating electrical characteristics.

The guard-ring pattern is formed on the same surface as the bottom of the first electrode, and the second electrode is extended to the edge of the cell area on the bottom of the guard-ring pattern. At least a part of the contact fill for the plate electrode is electrically connected to the second electrode in the guard-ring pattern. The contact fill for the plate electrode includes a tungsten fill that is formed of tungsten in the center, and barrier metal that is formed outside of the tungsten fill adjacent to a recessed portion, thereby preventing the formation of fluoric components that penetrate into a lower MOS transistor from a tungsten (W) layer, which is a filling metal layer. The barrier metal is a combination layer of Ti and TiN.

To achieve the above object, according to another embodiment, there is provided a method for manufacturing a semiconductor memory device. A cell area is separated from a peripheral circuit area on a semiconductor substrate to form device active areas. A plurality of MOS transistors are formed in the device active areas of the cell area and the peripheral circuit area. A first interlayer dielectric (ILD) film is formed on the semiconductor substrate and a first electrode pattern and a guard-ring pattern surrounding the cell area are formed on the first ILD film. A conductive layer for a first electrode and an insulating layer for patterning are sequentially formed on the first electrode pattern and the guard-ring pattern. The entire cell area and a part of the guard-ring pattern are opened, and the conductive layer for the first electrode and the insulating layer for patterning are removed to the first ILD film, and a first electrode node in the cell area is formed. The insulating layer for patterning that is filled in the first electrode node is removed.

A dielectric layer and a conductive layer for a second electrode are formed on the semiconductor substrate. A pattern for the second electrode is formed on the conductive layer for the second electrode. A contact fill for a plate electrode is formed while being in contact with the second electrode that is formed on the sidewall and the bottom of the guard-ring pattern.

That is, in order to define the device active areas on the semiconductor substrate, the semiconductor substrate is partially recessed to a predetermined depth and forming a trench, and a silicon insulating layer is filled in the trench. Then, a gate insulating layer is formed on the device active areas, and a gate conductive layer is formed on the gate insulating layer. A mask insulating layer is formed on the gate conductive layer. In this case, preferably, the gate conductive layer is conductive polysilicon such as an impurity doped polysilicon or polycide, which is combined with metal suicide, thereby improving the conductivity of the gate. Then, a gate pattern is formed on a mask insulating layer and a gate conductive layer through a photolithographic process, and an insulating layer for a sidewall spacer is formed on the sidewall of the gate pattern, thereby completing a gate process. Then, source and drain junctions are formed by an ion implantation method using the gate as a mask. Here, the insulating layer for the sidewall spacer is a silicon nitride layer, thereby increasing dry etch selectivity with a silicon oxide layer when a self-aligned contact is formed. The source and drain areas form an N-type junction in the cell area, and form N-type and P-type junctions in the peripheral circuit area. A silicon insulating layer is formed, and a bit line conductive layer that is formed of polysilicon such as an impurity doped polysilicon and metal suicide, and a mask insulating layer for self-alignment that is formed of silicon nitride are formed on the silicon insulating layer. A bit line pattern is formed on the bit line conductive layer and the mask insulating layer for self-alignment, and then, an insulating layer spacer that is formed of silicon nitride is formed on the sidewall of the bit line pattern. In a case where the silicon insulating layer is formed, and the self-aligned contact is formed, the mask insulating layer and the insulating layer spacer that are formed of silicon nitride serve as a mask for dry etching.

A capacitor contact that is connected to the source area of the MOS transistor is formed to be electrically connected to the MOS transistor using a self-alignment method, and a capacitor contact pad is formed by filling a conductive layer in the capacitor contact. A first ILD film is thickly formed on the semiconductor substrate, and a photoresist is formed on the first ILD film.

A first electrode pattern is formed in the cell area in the photoresist and a band-shaped guard-ring pattern is formed in a boundary between the cell area and the peripheral circuit area while surrounding the cell area. In this case, the first ILD film includes a silicon nitride layer as an etch stopper in a lower portion of the first ILD film, and includes a silicon oxide layer that is formed on the etch stopper. As a result, another layer may be used as an etch stopper when a subsequent etching process having high selectivity is performed, and the silicon nitride layer, which is an etch stopper, is formed to be much thinner than the silicon oxide layer, thereby increasing the capacitor area after the silicon oxide layer is removed. Then, a first electrode pattern is formed in the cell area on the first ILD film through dry etching using the patterned photoresist as a mask, and a guard-ring pattern is formed in a boundary between the cell area and the peripheral circuit area while surrounding the cell area.

A conductive layer for a first electrode that is conductive polysilicon, such as an impurity doped polycrystalline silicon, and an insulating layer for patterning that is formed of silicon oxide by chemical vapor deposition (CVD) are sequentially formed in the first electrode pattern and the guard-ring pattern. Here, the insulating layer for patterning is formed in particular through plasma-enhanced CVD (PE CVD) using plasmas having a high deposition rate and a high etching rate in an etching solution. In this case, the conductive layer for the first electrode further includes a barrier layer that is one selected from TiN, RuO, Pt, Rb, and RbO, thereby preventing impurities that are contained in materials to be used later as a dielectric layer from into the MOS transistor and from deteriorating the electrical characteristics of the semiconductor memory device.

A photoresist is formed on the insulating layer for patterning, and a cell opening pattern is formed in the photoresist so that the peripheral circuit area is blocked and only the cell area is opened. The second insulating layer and the conductive layer for the first electrode are sequentially etched and removed through dry etching using the cell open pattern as a mask, thereby forming a first electrode node of the capacitor. The first electrode node is formed in the cell area, and the conductive layer for the first electrode is left in the peripheral circuit area, thereby protecting the first ILD film.

The insulating layer for patterning is wet etched and removed with an etching solution. Beneficially, the etching solution is a silicon oxide etchant containing hydrofluoric acid (HF) and buffered oxide etchant (BOE). As a result, the silicon nitride layer which composes the lower portion of the first ILD film is an etch stopper in the cell area, and polysilicon which composes the conductive layer for the first electrode is an etch stopper in the peripheral circuit area and the guard-ring pattern, thereby forming the first electrode node in the cell area, and the first ILD film that is formed of silicon oxide to the height of the first electrode is protected in the peripheral circuit area.

A dielectric layer is formed on the exposed surface of the first electrode node, and a conductive layer for a second electrode is formed on the dielectric layer so that the inside of the first electrode node is filled. In this case, the dielectric layer is formed of at least one selected from silicon nitride, silicon oxide, and a high dielectric material, and the high dielectric material is one selected from $Ta_2O_5$, $Al_2O_3$ and PZT, PLZT, and BST as perovskite-family ferroelectric materials. The conductive layer for the second electrode is conductive polysilicon, such as an impurity-doped polysilicon, and the conductive layer for the second electrode further includes a barrier layer, thereby preventing impurities from penetrating into a layer at an external side in a case where the dielectric layer is a high dielectric layer.

A photoresist is formed on the conductive layer for the second electrode, and a second electrode pattern having a block shape is formed in the photoresist so that a part of the second electrode pattern partially overlaps the peripheral circuit area including the cell area and the guard-ring pattern. The conductive layer for the second electrode, the dielectric layer and the conductive layer for the first electrode remaining in the peripheral circuit area are etched through dry etching using the patterned photoresist as a mask.

A second ILD film that is formed of silicon oxide through CVD is formed on the entire surface of the semiconductor substrate. A photoresist is formed on the second ILD film, and a contact pattern for a plate electrode having a block shape is formed in the photoresist to be larger than the actual size of an area where it overlaps the guard-ring pattern. The second ILD film in the guard-ring pattern is dry etched and completely removed by using the patterned photoresist as a mask, and a contact for the plate electrode is formed so that the sidewall and the bottom of the second electrode in the guard-ring pattern are completely exposed. Then, a contact filling conductive layer is formed of tungsten (W), and the contact filling conductive layer is removed evenly to the second ILD film, thereby forming a contact fill for the plate electrode. In this case, the contact filling conductive layer further includes Ti and TiN as a barrier layer.

In the semiconductor memory device and the method for manufacturing the same as disclosed herein, the guard-ring pattern is formed in a boundary between the cell area and the peripheral circuit area while surrounding the cell area, and thereby a step caused by manufacturing the stack-shaped capacitor is removed during a manufacturing process. In addition, the contact fill for the plate electrode is formed in the guard-ring pattern through a self-aligned contact method, and thereby the contact for the plate electrode is in direct contact with the bottom and the sidewall of the second electrode as a ground electrode. Thus, the contact area is increased greatly, the contact resistance is substantially reduced, and the electrical characteristics of the memory device are more stabilized.

BRIEF DESCRIPTION OF THE DRAWINGS

The above object and advantages of the present invention will become more apparent by describing in detail a preferred embodiment thereof with reference to the attached drawings in which.

DETAILED DESCRIPTION

Figure 1A:
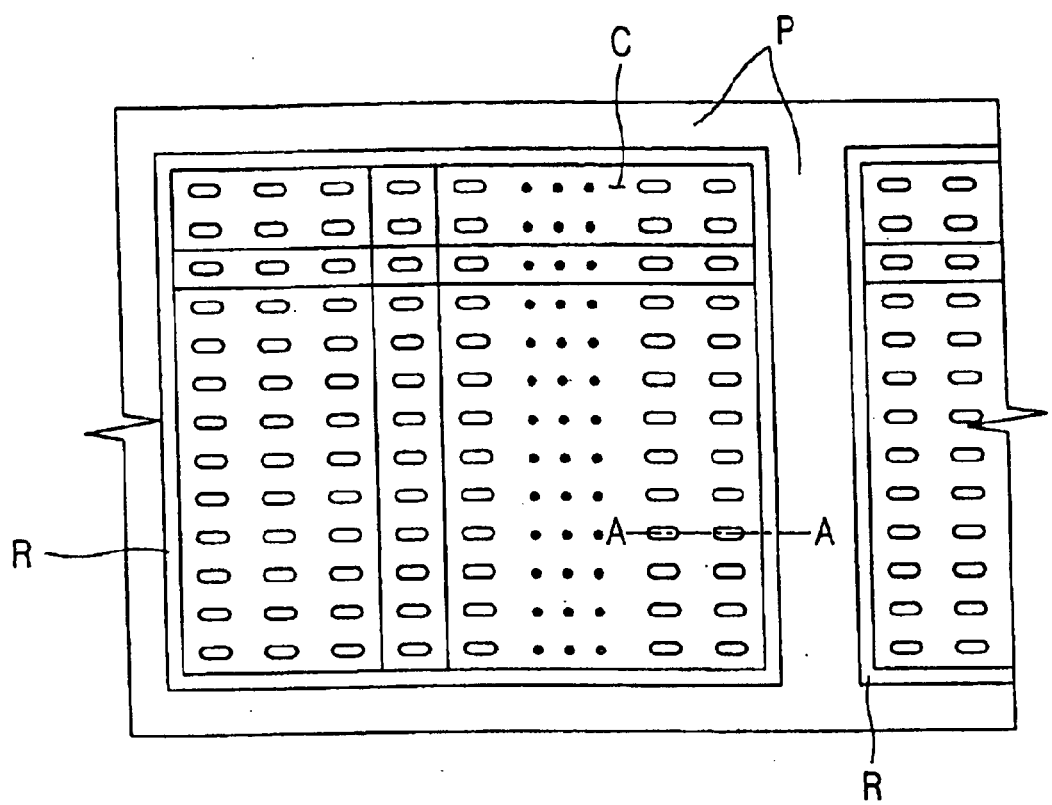
FIG. 1A is a plane view of a semiconductor memory device according to an embodiment of the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity.

Figure 1B:
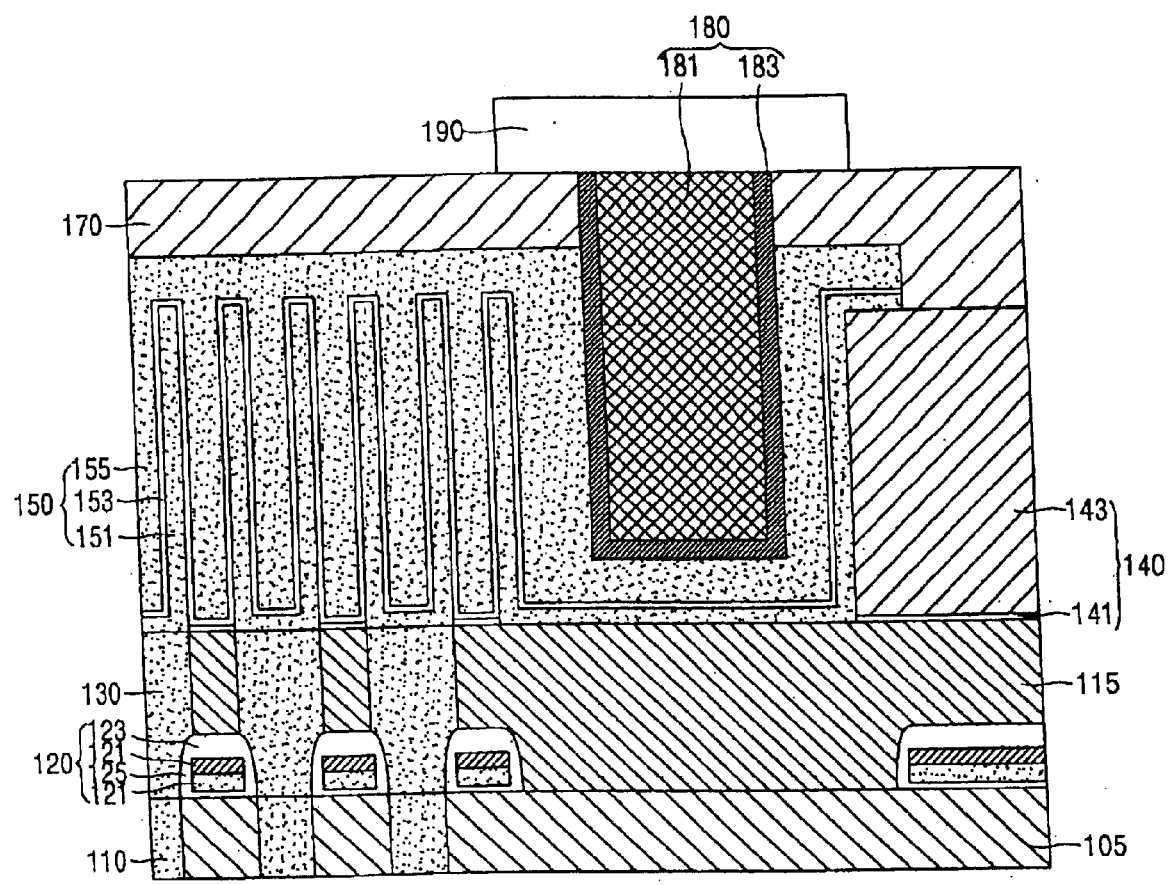
FIG. 1B is a cross-sectional view of the semiconductor memory device according to the embodiment shown in FIG. 1A.

FIG. 1A is a plane view of a semiconductor memory device according to an embodiment of the present invention, and FIG. 1B is a cross-sectional view taken along line A—A of FIG. 1A.

Referring to FIGS. 1A and 1B, the semiconductor memory device includes a cell area C in which memory devices are formed in a matrix shape, and a peripheral circuit area P formed to exchange signals with the memory devices. Included in the cell area C and the peripheral circuit area P are: an oxide layer (not shown) for isolating individual devices, which is formed in the form of a trench having a predetermined depth in a semiconductor substrate; a metal-oxide semiconductor (MOS) transistor comprised of gates (not shown), source areas (not shown), and drain areas (not shown) that are formed on a device area defined by the oxide layer for isolating individual devices; bit lines 120 that are linearly formed on an upper portion of the MOS transistor and are electrically connected to the drain areas of the MOS transistor; capacitors 150 that are formed on an upper portion of the bit lines 120 and are electrically connected to the source areas of the MOS transistor and comprised of a hollow cylindrical first electrode 151, a dielectric layer 153, and a second electrode 155 for covering the cell area C in the form of a block; a guard-ring pattern R that surrounds the cell area C in an interposed area between the cell area C and the peripheral circuit area P; and a contact fill 180 for a plate electrode, the bottom and sidewall of the contact fill 180 is in contact with the sidewall and bottom of the second electrode 155 that is extended to the guard-ring pattern R.

Here, the bit lines 120 include a bit line conductive layer 121 that is formed of doped polycrystalline silicon (polysilicon) and tungsten silicide on an upper portion of the cell area C, a mask insulating layer 123 for a self-aligned contact, and an insulating layer spacer 125, which are formed on the upper portion and the side of the bit line conductive layer 121, respectively. The mask insulating layer 123 for the self-aligned contact and the insulating layer spacer 125 that is formed of silicon nitride, serve as a mask in a case where the self-aligned contacts are etched to form contact pads 130 after a first interlayer dielectric (ILD) film 140 is later formed of silicon oxide formed through chemical vapor deposition (CVD).

The capacitors 150 include the cylindrical first electrode 151 (storage node) that is vertically in contact with the contact fill 110 and the contact pads 130, the dielectric layer 153 that is formed along the internal and external surface of the first electrode 151, and the second electrode 155, in which the dielectric layer 153 is interposed on the external surface of the first electrode 151. The contact fill 110 is connected to the source areas of the MOS transistor formed under the capacitors 150 for electrical connection to the source areas, and the contact pads 130 are formed between the bit lines 120 using the bit lines as a mask while being in contact with the upper portion of the contact fill 110. Here, the first electrode 151 and the second electrode 155 are conductive layers and are formed of an impurity-doped polysilicon, and the dielectric layer 153 is a combination layer of multi-layers such as oxide/nitride/oxide (ONO) or nitride/oxide (NO), in which silicon oxide is properly mixed with silicon nitride but is formed of a high dielectric material. The high dielectric material comprises $Ta_2O_5$, $Al_2O_3$ and one selected from ferroelectric materials such as PZT, PZLT, and BST. It is preferable that an extra barrier layer (not shown) is formed at the interface contacting the high dielectric material of the first electrode 151 and the second electrode 155 in a case where the high dielectric material is used to form the dielectric layer 153, and thereby preventing elements of impurity contained in the high dielectric material from infiltrating into the source and drain areas. A high density layer having a high degree of hardness, such as platinum (Pt), TiN, RbO, and RuO that are formed through either sputtering, CVD or electroplating, is used as the barrier layer. The second electrode 155 includes the entire cell area C in which memory devices are formed, and the guard-ring pattern R, and thus, it is easy to form the contact fill 180 for the plate electrode on the second electrode 155 that is formed in the guard-ring pattern R.

The guard-ring pattern R is formed in the form of a ring and is interposed between the cell area C and the peripheral circuit area P and surrounding the cell area C, and has a trench shape that is dug into the first ILD film 140, having a predetermined thickness from the upper portion of the contact pads 130. The second electrode 155 is extended to the both sidewalls and the bottom of the guard-ring pattern R, and the sidewall of the first ILD film 140 of the guard-ring pattern R serves as a mask for partially self-aligned contact patterns when the contacts of the contact fill 180 for the plate electrode connected to the second electrode 155 are formed.

To form the contact fill 180 for the plate electrode, contacts (not shown) for plate electrodes are formed in the first ILD film 140 using a method for forming self-aligned contacts so that the sidewall and the bottom of the second electrode 155 that is extended to the bottom of the guard-ring pattern R are exposed, and a barrier layer 181 is formed along the internal sidewalls and the bottoms of the contacts, and a metal layer 183 such as a tungsten layer, is filled into the barrier layer 181. The barrier layer 181 is formed of WN and TiN as conductive nitride, and in order to reduce ohmic resistivity with silicon, a titanium (Ti) layer is further formed between the barrier layer 181 and the second electrode 155.

Meanwhile, reference numerals 105 and 115 denote underlying ILD films, respectively. Reference numeral 105 is the ILD film between gate and bit lines, and reference numeral 115 is the ILD film between the bit lines and the capacitors.

FIGS. 2 through 9 are cross-sectional views illustrating a method for manufacturing a semiconductor memory device in sequence.

Figure 2:
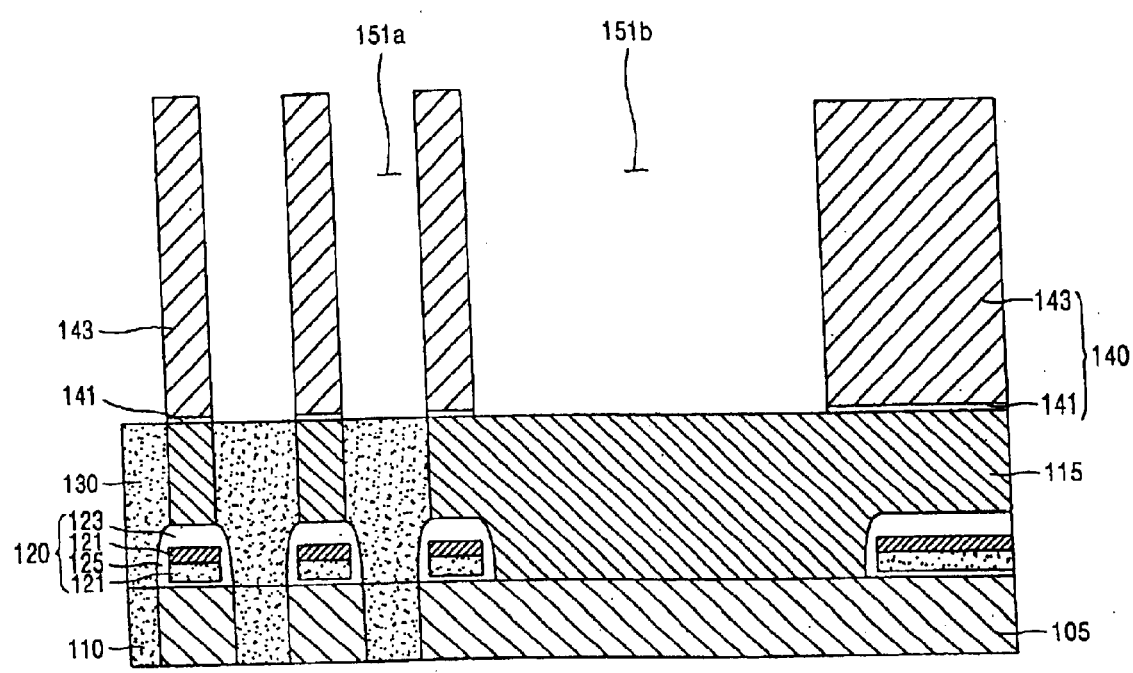
FIGS. 2 through 9 are cross-sectional views illustrating a method for manufacturing a semiconductor memory device according to an embodiment of the present invention in sequence.

Referring to FIG. 2, an insulating layer (not shown) for isolating individual devices is formed on the semiconductor substrate and is divided into a cell area C and a peripheral circuit area P to form device areas. Then, a gate insulating layer, a gate conductive layer, and an insulating layer for a mask are sequentially formed in the device areas, and gate patterns are formed in the gate conductive layer and the gate insulating layer, and an insulating layer spacer is formed on the sidewalls of the gate patterns, thereby completing a gate. By ion implantation using a predetermined patterned photoresist and the gates as a mask, junction areas between the gates are formed, and thus, the source and drain areas are formed at both sides of the gate, thereby completing a MOS transistor process. Silicon oxide as a first ILD film 105 is thickly formed, and thereby capacitor contacts are formed only in the cell area in which the MOS transistor is formed, through self-alignment, and the contacts are filled with conductive materials, and thereby forming contact fill 110 for connecting with the capacitor.

So, the first ILD film 105 formed of silicon oxide is formed on the entire surface of the semiconductor substrate on which the contact fill 110 is formed, and the bit lines are formed on the first ILD film 105 through a predetermined process of forming bit lines. That is, conductive polysilicon 121 in which bit line impurities are doped, and a metal silicide layer 122 such as a tungsten silicide layer, are sequentially formed, and an insulating layer 123 for a self-aligned mask is formed on the bit line conductive layers 121 and 122. A bit line patterning step is performed in the insulating layer 123 for the self-aligned mask and in the bit line conductive layers 121 and 122 through predetermined photolithographic and dry etching processes. A silicon insulating layer is formed as an insulating layer for a sidewall spacer on the entire surface of the semiconductor substrate 100 and anisotropically etched to form an insulating layer spacer 125 for the bit line on the sidewall of the insulating layer 123 for self-aligned mask. In such a case, the insulating layer 123 for the self-aligned mask and the insulting layer spacer 125 for the bit line are silicon nitride layers formed by CVD. After processes related to the bit lines are completed, a silicon oxide layer 115 is formed as an ILD film on the entire surface of the semiconductor substrate, and contact patterns are formed in the silicon oxide layer 115 using a predetermined method for forming self-aligned contacts, and the contacts are filled with conductive layers, thereby forming the contact pads 130.

A silicon nitride layer 141 and a silicon oxide layer 143 are sequentially formed on the entire surface of the semiconductor substrate 100 onto which the contact pads 130 are exposed, thereby forming the first ILD film 140. Through the photolithographic and dry etching processes, a reverse pattern 151a for a first electrode (151 of FIG. 1B) and a guard-ring pattern (R) 151b that is to be spaced apart from the peripheral circuit area P by a predetermined width surrounding the cell area C, are formed in the first ILD film 140, thereby exposing the capacitor contact pads 130 in the cell area C. In such a case, the silicon nitride layer 141 serves as an etch stopper when wet and dry etching, and thus, preferably, the silicon nitride layer 141 is formed to a minimum thickness required for wet and dry etching. In addition, the thickness of the silicon oxide layer 143 is proportional to the surface area of the node of the first electrode 151 to be later formed, and thus, preferably, the silicon oxide layer 143 is formed to be as thick as possible, to increase the capacity of the capacitor.

Figure 3:
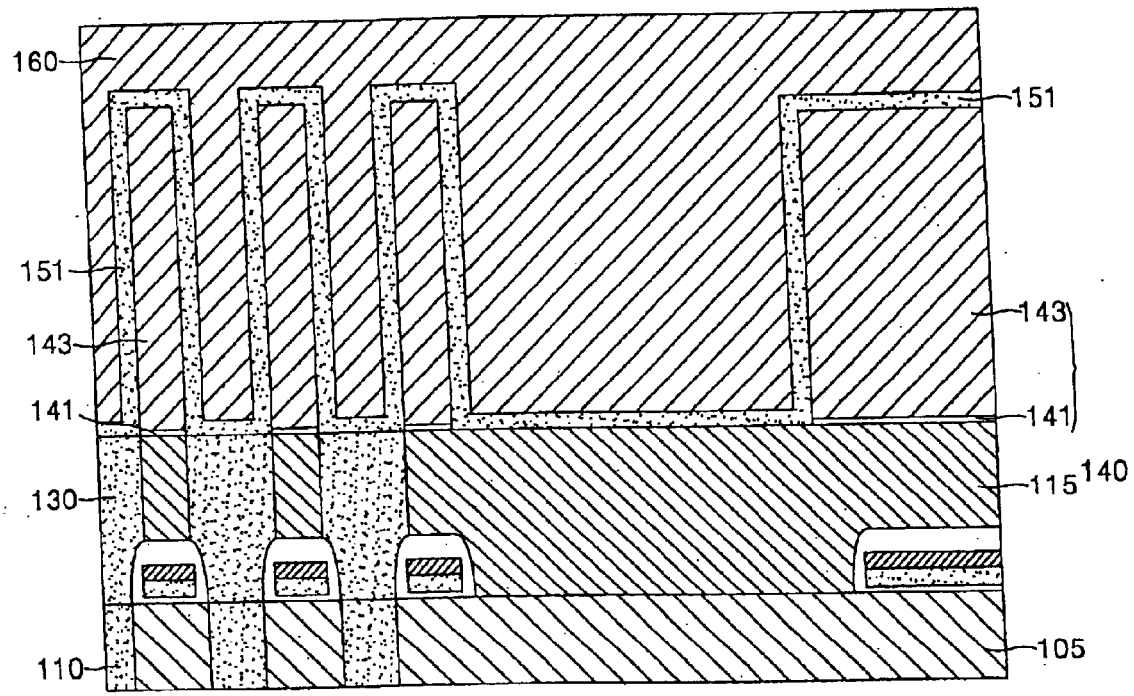

Referring to FIG. 3, a conductive layer 151 for a first electrode and a third insulating layer for patterning 160 are formed on the entire surface of the semiconductor substrate on which the reverse pattern 151a for first electrode and the guard-ring pattern 151b are formed. In such a case, the conductive layer 151 for the first electrode is formed of impurity-doped polysilicon and is formed to a proper thickness along the sidewall of the first ILD film 140 so that a cylindrical space is formed in the reverse pattern 151a for the first electrode. The third insulating layer for patterning 160 is a silicon oxide layer that is formed through CVD and is preferably formed through CVD using plasma having a high deposition speed and a high etching speed during a wet etching step.

Figure 4:
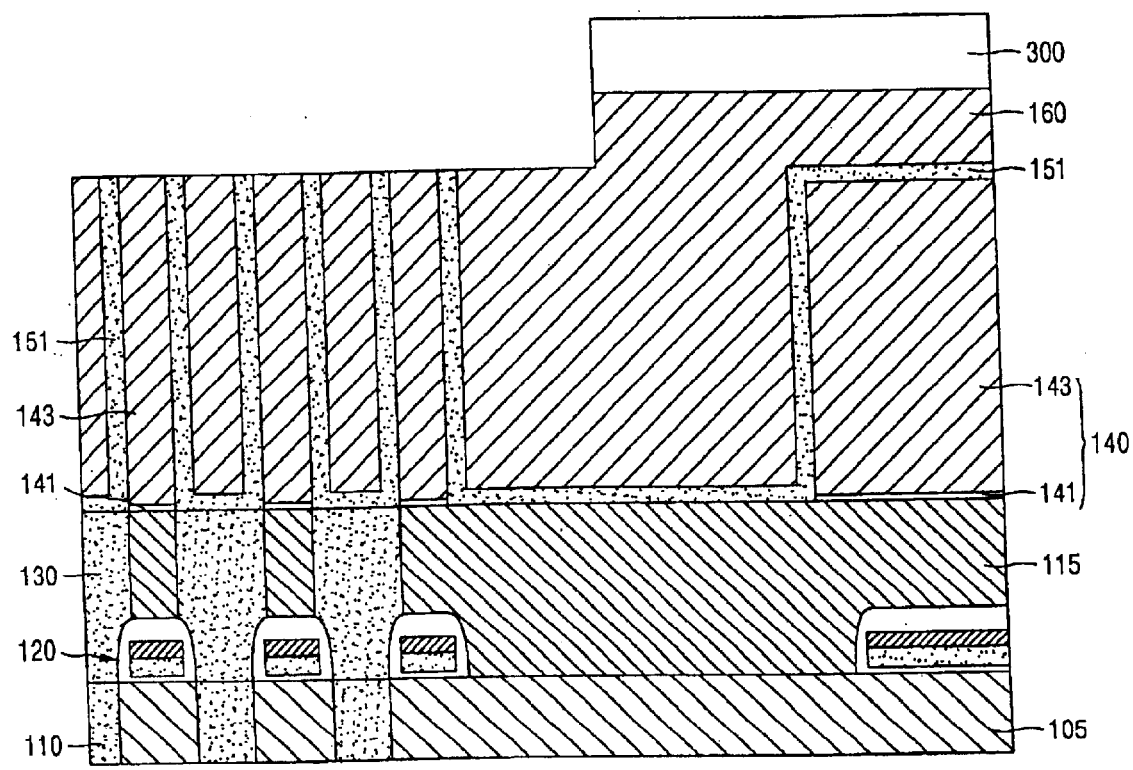

Referring to FIG. 4, a photoresist layer 300 is formed on the entire surface of the semiconductor substrate 100, and a cell opening pattern is formed in the photoresist 300 in block units that are formed by the cell area C so that the third insulating layer for patterning 160 is exposed. In such a case, it is effective that the cell opening pattern is extended to the guard-ring pattern 151b which surrounds the cell area C to a predetermined thickness and at least partially overlaps the guard-ring pattern 151b, because the cell area C is completely exposed, and the peripheral circuit area P is completely blocked. The third insulating layer for patterning 160 is removed evenly to the conductive layer 151 for the first electrode by etching in the cell area C through dry etching using a mask. The polysilicon as the exposed conductive layer 151 for the first electrode, is etched evenly through dry etching and removed. Then, nodes are separated from the first electrode 151 and formed. In such a case, in view of a step between the cell area C and the peripheral circuit area P, the peripheral circuit area P is higher than the cell area C to be near to the thickness of the third insulating layer 160 for patterning.

Figure 5:
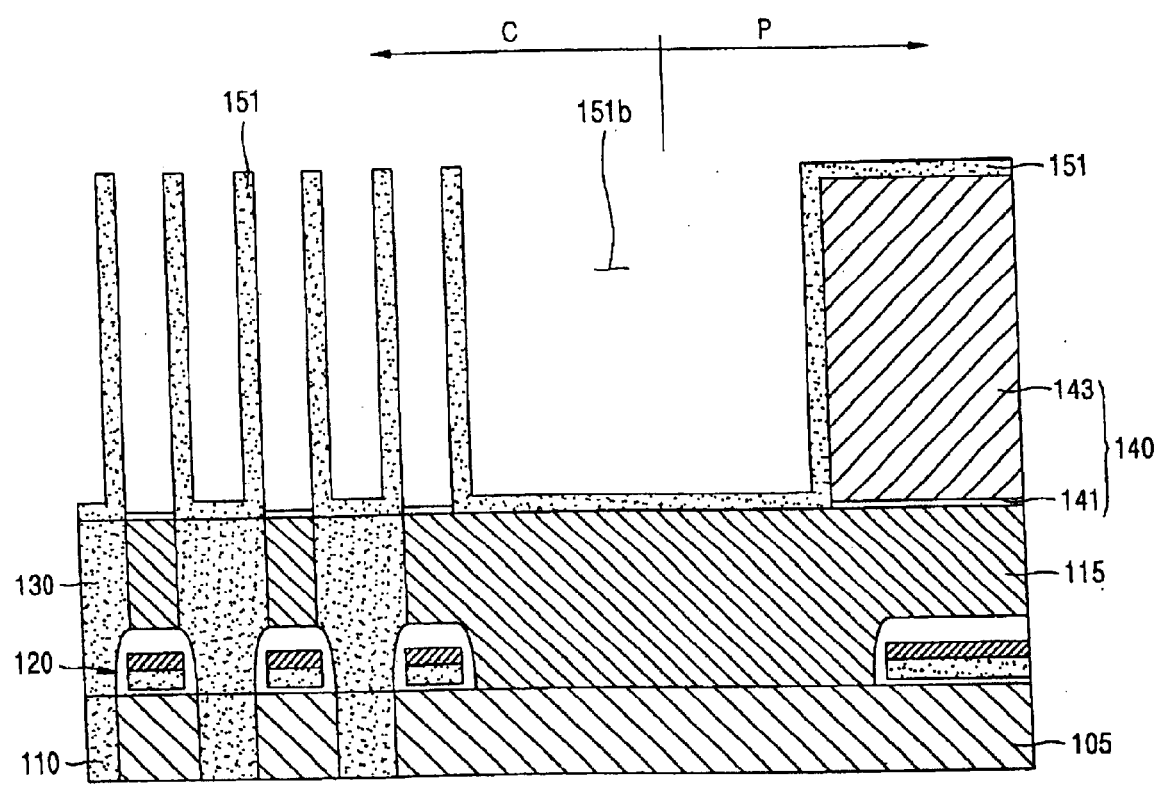

Referring to FIG. 5, the silicon oxide layer as the third insulating layer for patterning 160 that is filled between the first electrodes 151 adjacent to the inside of the node of the first electrode 151, is completely removed through wet etching using an etchant. That is, the silicon oxide layer is dipped in a solution container in which an etchant (buffered oxide etch (BOE) and hydrofluoric acid (HF) solution) containing HF is filled, with etching solution, and the silicon oxide layer is maintained in the dipped state for a predetermined amount of time, and thereby the silicon oxide layer is completely removed to the level of the polysilicon, and the silicon nitride layer 141 as an etch stopper. Thus, as shown in FIG. 5, the node of the first electrode 151 is finished, and the silicon oxide layer 160 of the guard-ring pattern 151b is completely removed, and thereby the guard-ring pattern R is formed.

Figure 6:
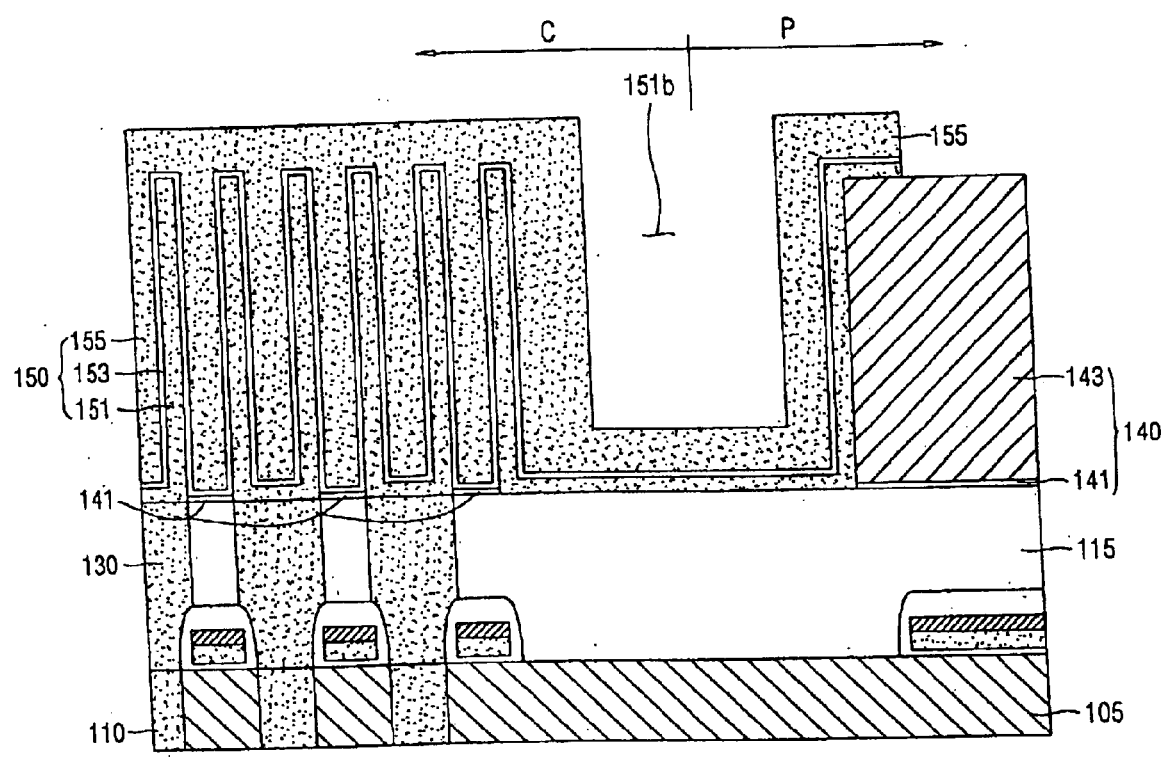

Referring to FIG. 6, after the node of the first electrode 151 is finished, the dielectric layer 153 and a conductive layer 155 for the second electrode are sequentially formed in the node of the first electrode 151. In such a case, an oxide/nitride/oxide (ONO) or nitride/oxide (NO) layer as a combination layer of silicon oxide and silicon nitride, may be used as the dielectric layer 153, or a high dielectric layer may be formed as the dielectric layer 153.

Since the high dielectric layer has a very high dielectric constant per unit area, as memory devices become highly integrated, the height of the node of the first electrode 151 may be properly limited. The high dielectric layer includes $Ta_2O_5$ and $Al_2O_3$ that are formed through CVD or physical vapor deposition (PVD), or PZT, PLZT, and BST as perovskite-family ferroelectric materials. In the case of forming the high dielectric layer, a barrier layer (not shown) having high density and hardness such as platinum (Pt), RbO or RuO, is further included before the dielectric layer 153 is formed on the surface of the first electrode 151, thereby preventing metal atoms which compose the dielectric layer 153 from penetrating into a lower MOS transistor and from affecting the electrical characteristics of the semiconductor memory device.

The conductive layer 155 for the second electrode is formed of doped polysilicon and is preferably formed at least to a thickness more than one half of the width of the node of the first electrode 151, to completely fill the empty space in the node of the first electrode 151 and a space that is formed between the nodes of the first electrode 151. Then, the surface of the cell area C is planarized with the conductive layer 155 for the second electrode, and only the guard-ring pattern 151b follows the pattern, and thereby a recessed portion is formed in the center of the guard-ring pattern 151b.

After that, a photoresist layer (not shown) is coated on the entire surface of the semiconductor substrate 100, and a pattern for the second electrode is formed through predetermined photolithographic and dry etching processes. That is, the photoresist layer is formed on the semiconductor substrate 100 on which the conductive layer 155 for the second electrode is formed, and the pattern for the second electrode is formed in the photoresist through an alignment exposure process. The second electrode 155, the dielectric layer 153, and the first electrode 151 are sequentially etched using the patterned photoresist as a mask through dry etching, and thereby the pattern for the second electrode is formed. Then, a pattern for the second electrode 155, that is formed in block units in which the entire cell area C and a part of the peripheral circuit area P overlap with each other, is completed. In such a case, the conductive layer 151 for the first electrode in the peripheral circuit area P, which is connected to the cell area C, is completely removed, and thereby an electrically-insulated state is formed.

Figure 7:
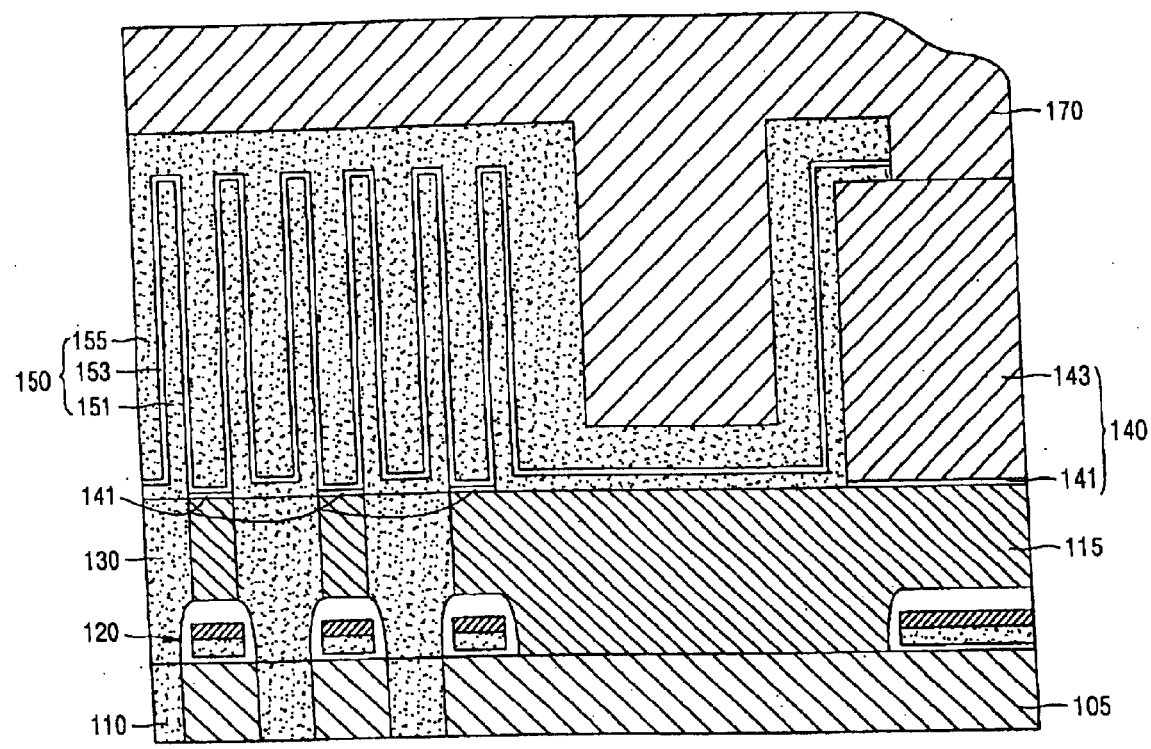
Figure 8:
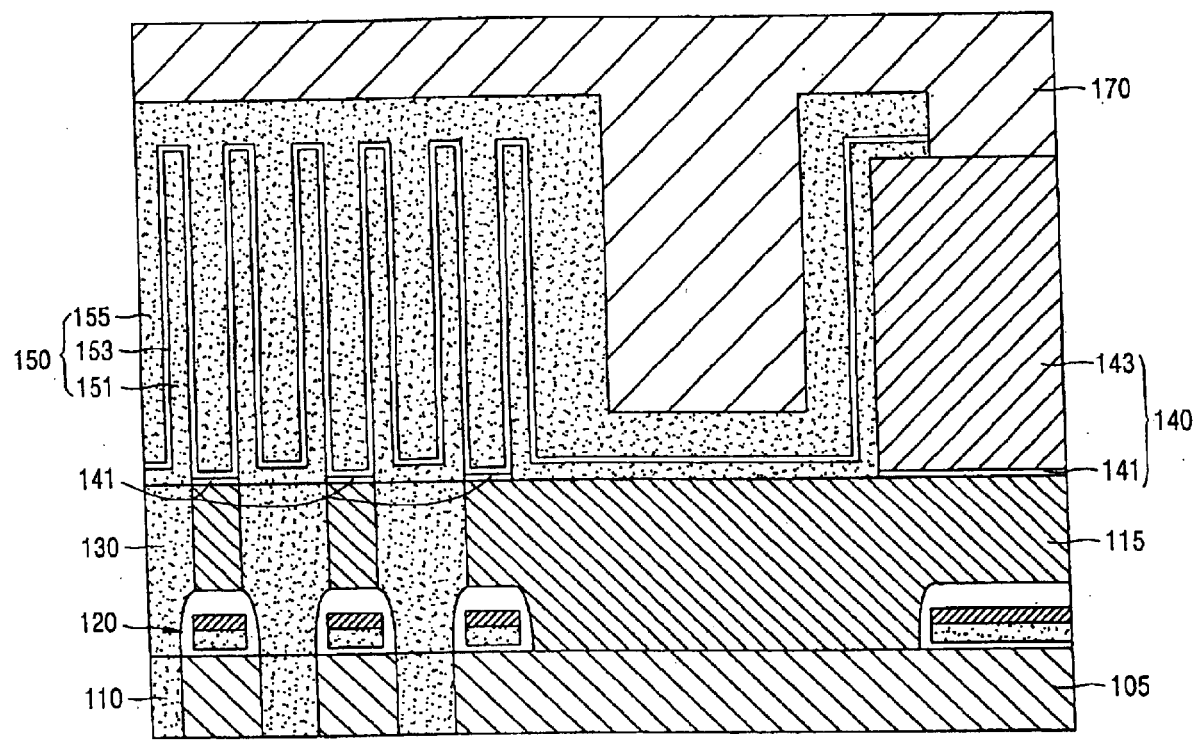

Referring to FIGS. 7 and 8, a second ILD film 170 is thickly formed, and thereby step between the cell area C and the peripheral circuit area P is removed, and the surface of the semiconductor substrate 100 is planarized.

That is, the silicon oxide layer is formed as the second ILD film 170 on the semiconductor substrate 100 through CVD so that the recessed portion of the guard-ring pattern 151b is completely buried and planarized. In such a case, a step between the cell area C and the peripheral circuit area P is removed. The second ILD film 170 is a silicon oxide layer such as an undoped silicate glass (USG) formed through CVD using plasma, or doped silicon oxide layer such as boro-phospho silicate glass (BPSG) formed through CVD. Then, if additional planarization is required, the second ILD film 170 may be further planarized using thermal treatment such as chemical mechanical polishing (CMP) or BPSG reflow.

Figure 9:
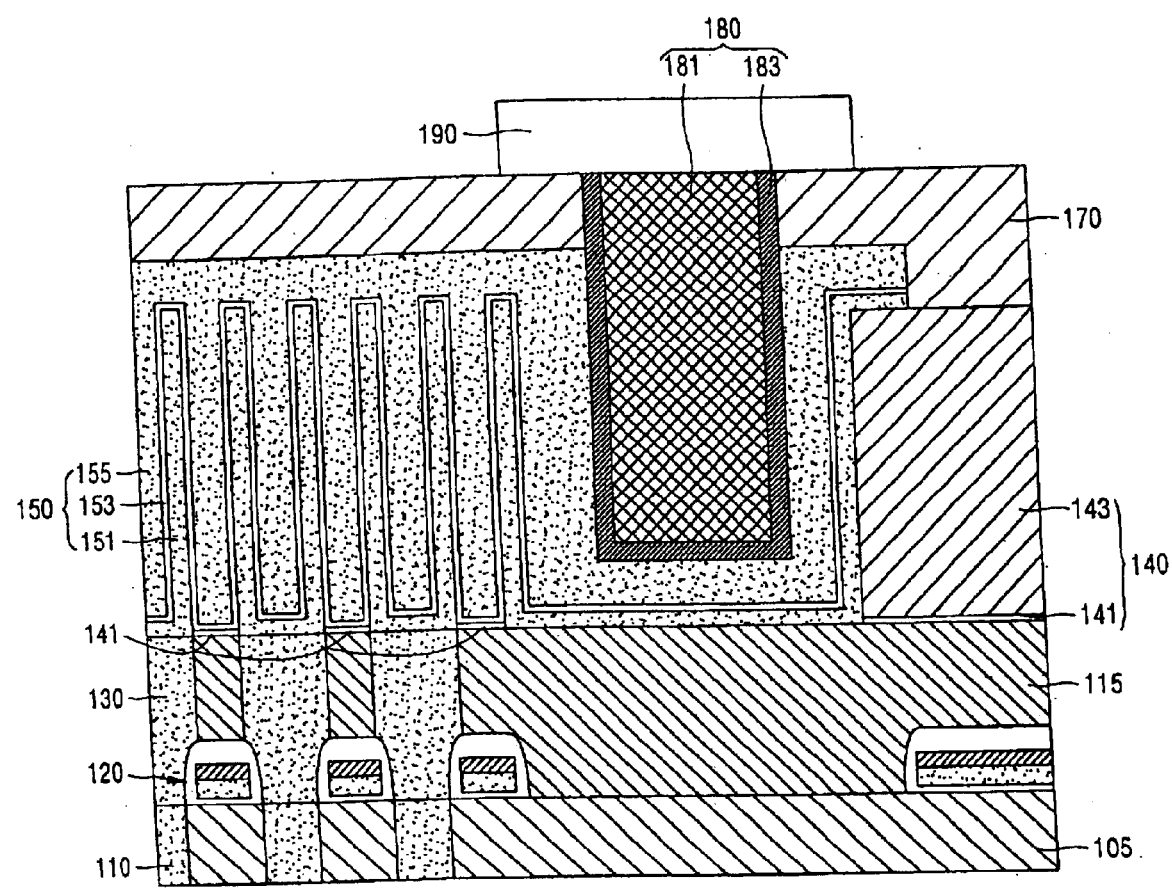

Referring to FIG. 9, contacts for plate electrode are formed on the second ILD film 170, and the contacts for plate electrode are filled with a conductive layer to form a contact fill 180, and then, metal interconnection 190 is formed on the contact fill 180 through a predetermined metal interconnection process.

A photoresist is formed on the second ILD film 170, and contact patterns for plate electrode are formed on the photoresist. In such a case, the contact patterns for the plate electrode are formed in block type to be larger than the actual size including a part of the guard-ring pattern 151b. When a dry etching step is performed using the patterned photoresist as a mask, the sidewall of the second electrode 155 formed in the guard-ring pattern 151b serves as an etching mask for self-alignment, and the second ILD film 170 is completely etched and removed to the conductive layer 155 for the second electrode, and the sidewall and the bottom of the second electrode 155 are exposed, and contacts having a block shape are formed.

When the contacts for the plate electrode are formed so that the sidewall and the bottom of the second electrode 155 are exposed, the barrier layer 181 and the metal layer 183 are sequentially formed on the entire surface of the semiconductor substrate 100 to completely bury the contacts. Then, the metal layer 183 and the barrier layer 181 are sequentially removed through etch back using dry etching or chemical mechanical polishing (CMP), and the contact fill 180 for the plate electrode is formed in the contacts so that the sidewall and the bottom of the second electrode 155 are in contact with the inside of the contacts. In such a case, the barrier layer 181 is a conductive metal nitride layer such as TiN or WN that is formed through sputtering or CVD, and the barrier layer 181 further includes Ti as a glue layer. The metal layer 183 is tungsten and is formed through CVD.

Figure 10:
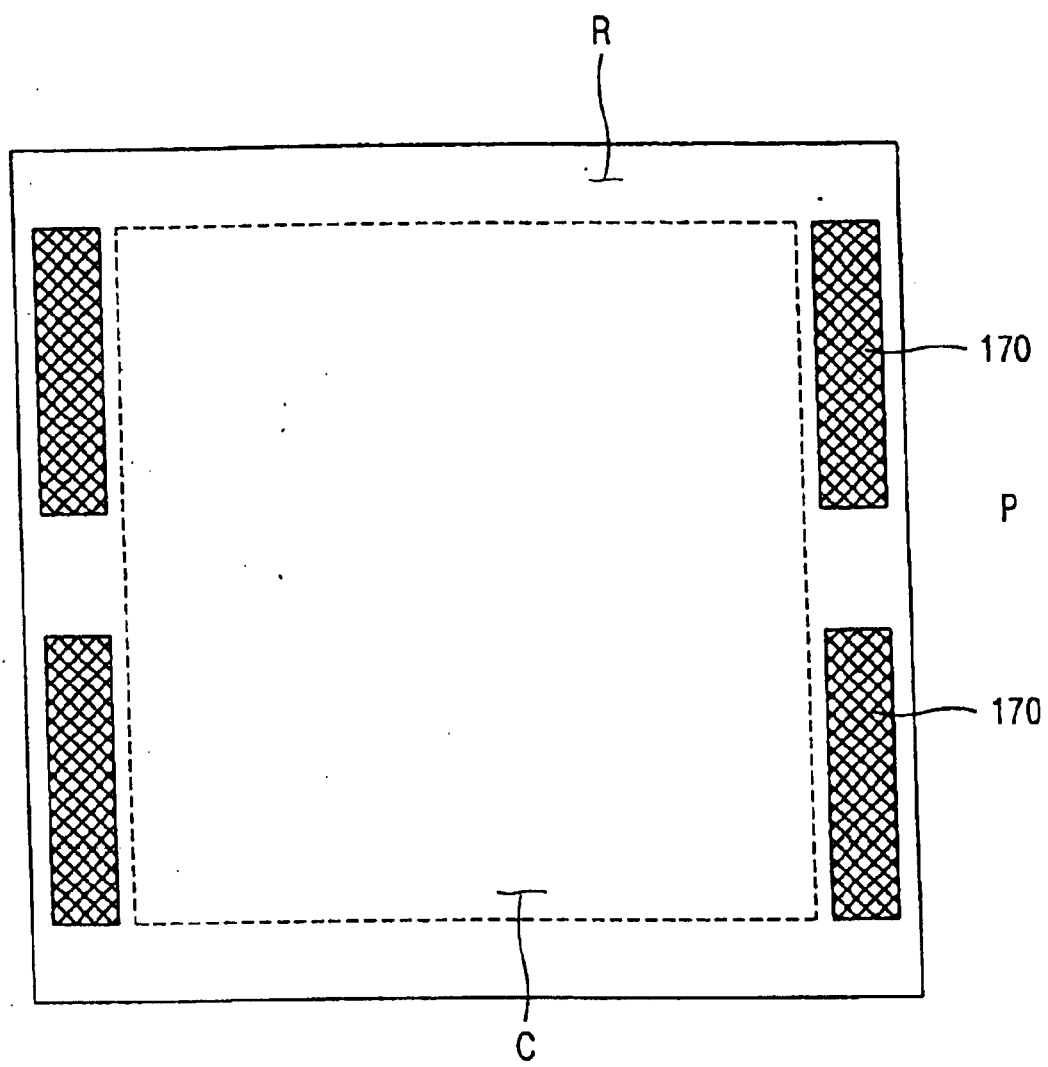
FIG. 10 is a plane view of cell patterns after the steps shown in FIGS. 2 through 9 are performed.

FIG. 10 is a plane view of the cell area of the semiconductor substrate after the above-mentioned steps are performed. Referring to FIG. 10, the cell area C and the peripheral circuit area P of the semiconductor substrate 100 are covered with the second ILD film 170, and only an upper portion of the contact fill 180 for the plate electrode that is formed in block type to cover a predetermined section of the guard-ring pattern R which surrounds the cell area C is exposed.

A metal layer is formed on the entire surface of the semiconductor substrate, and a predetermined metal interconnection process is performed, and the metal interconnection 190 is formed so that the contact fill 180 for the plate electrode is connected to ground. Then, an additional process is performed using a semiconductor memory device manufacturing process, and thereby the semiconductor memory device is completed.

In the method for manufacturing a semiconductor memory device as disclosed herein, the guard-ring pattern R is formed between the cell area C and the peripheral circuit area P, and the contact fill 180 having a block shape for the plate electrode is formed in the guard-ring pattern R. Thereby a step between the cell area C and the peripheral circuit area P can be easily removed without an extra planarization process while a process is performed. The contact fill 180 for the plate electrode, which connects the second electrode 155 to external ground, is formed in block type in the guard-ring pattern R and is in contact with the bottom and the sidewall of the second electrode 155. Thereby, the contact area of the contact fill 180 for the plate electrode is widened, and thus, the contact resistance to ground is lowered, and the electrical characteristics of the semiconductor memory device are improved.

When the contacts are formed in the guard-ring pattern R, anisotropic plasma etching or wet etching may be further included so as to etch and remove the second ILD film 170. Then, a residual oxide layer which may remain on the sidewall of the second electrode 155 is completely removed such that the sidewall of the second electrode 155 is completely exposed.

In the method for manufacturing a semiconductor memory device according to another embodiment, contacts that are formed in the area of the guard-ring pattern R may be formed on the entire guard-ring pattern R, or four contacts having a long rectangular side may be formed along each side which surrounds the cell area C of the guard-ring pattern R. Then, the area of the contacts for ground is widened, and thus, the ground resistance is further reduced.

In the method for manufacturing a semiconductor memory device as described above, the guard-ring pattern is formed to surround the cell area between the cell area and the peripheral circuit area, and thereby a step between the cell area and the peripheral circuit area can be easily removed while a related process is performed without any need for increasing the number of processes.

In addition, the contacts for the plate electrode are formed in the guard-ring pattern, and thereby the sidewall of the insulating layer of the guard-ring pattern can be used as a mask for forming self-alignment contacts, and thus, a process of forming contacts can be easily performed.

Furthermore, in the semiconductor memory device as disclosed above, the contacts for the plate electrode are formed in block type in the guard-ring pattern, and thus, the area of the contacts is wide, and the ground resistance is reduced, and the electrical characteristics of the semiconductor memory device are improved.

What is claimed is:

1. A method for manufacturing a semiconductor memory device, the method comprising:
    a) separating a cell area from a peripheral circuit area on a semiconductor substrate and forming device active areas;
    b) forming a plurality of MOS transistors in the device active areas of the cell area and the peripheral circuit area;
    c) forming a first interlayer dielectric (ILD) film on the semiconductor substrate and forming a first electrode pattern and a guard-ring pattern surrounding the cell area on the first ILD film;
    d) sequentially forming a conductive layer for a first electrode and an insulating layer for patterning on the first electrode pattern and the guard-ring pattern;
    e) opening the entire cell area and a part of the guard-ring pattern, removing the conductive layer for the first electrode and the insulating layer for patterning to the first ILD film, and forming a first electrode node in the cell area;
    f) removing the insulating layer for patterning that is filled in the first electrode node;
    g) forming a dielectric layer and a conductive layer for a second electrode on the semiconductor substrate;
    h) forming a pattern for a second electrode on the conductive layer for the second electrode; and
    i) forming a contact fill for a plate electrode while being in contact with the second electrode that is formed on the sidewall and the bottom of the guard-ring pattern.

2. The method of claim 1, wherein the step a) includes the step of forming an insulating layer for isolating individual devices to define device active areas.

3. The method of claim 2, wherein the step of forming an insulating layer for isolating individual devices includes the steps of:
    partially subsiding the semiconductor substrate to a predetermined depth and forming a trench; and
    filling a silicon insulating layer in the trench.

4. The method of claim 1, wherein the step b) includes the steps of:
    forming a gate on the device active areas;
    forming source and drain junctions at both sides of the gate; and
    forming a bit line on the gate.

5. The method of claim 4, wherein the step of forming a bit line includes the steps of:
    forming a silicon insulating layer on the semiconductor substrate;
    forming a bit line conductive layer and a mask insulating layer for self-alignment;
    forming a bit line pattern on the bit line conductive layer and the mask insulating layer for self-alignment; and
    forming an insulating layer spacer on the sidewall of the bit line pattern.

6. The method of claim 5, wherein the bit line conductive layer is a polycide layer in which conductive polysilicon like as impurity-doped polysilicon is combined with a metal silicide layer.

7. The method of claim 5, wherein the mask insulating layer for self-alignment and the insulating layer spacer are formed of silicon nitride.

8. The method of claim 1, wherein the step c) includes the steps of:
- forming a capacitor contact pad to be electrically connected to the MOS transistor;
- thickly forming a first ILD film on the semiconductor substrate;
- forming a photoresist on the first ILD film;
- forming a first electrode pattern in the cell area in the photoresist and forming a band-shaped guard-ring pattern in a boundary between the cell area and the peripheral circuit area while surrounding the cell area; and
- forming a first electrode pattern in the cell area on the first ILD film through dry etching using the patterned photoresist as a mask, and forming a guard-ring pattern in a boundary between the cell area and the peripheral circuit area while surrounding the cell area.

9. The method of claim 8, wherein the capacitor contact pad is formed by filling a conductive layer in a contact that is formed through self-alignment.

10. The method of claim 9, wherein the conductive layer is conductive polysilicon like as impurity-doped polycrystalline silicon.

11. The method of claim 8, wherein the first ILD film includes a silicon nitride layer as an etch stopper in a lower portion of the first ILD film, and includes a silicon oxide layer that is formed on the etch stopper.

12. The method of claim 11, wherein the etch stopper is thinner than the silicon oxide layer.

13. The method of claim 1, wherein in the step d), the conductive layer for first electrode is conductive polysilicon like as impurity-doped polysilicon.

14. The method of claim 13, wherein the conductive layer for first electrode further includes a barrier layer.

15. The method of claim 14, wherein the barrier layer is one selected from TiN, RuO, Pt, Rb, and RbO.

16. The method of claim 1, wherein in the step d), the insulating layer for pattern is a silicon oxide layer that is formed through chemical vapor deposition (CVD).

17. The method of claim 1, wherein the step e) includes the steps of:
- forming a photoresist on the insulating layer for patterning;
- forming a cell open pattern in the photoresist so that the peripheral circuit area is blocked and only the cell area is opened; and
- sequentially etching and removing the second insulating layer and the conductive layer for first electrode through dry etching using the cell open pattern as a mask.

18. The method of claim 17, wherein the cell open pattern is formed in the form of block so that the cell open pattern is extended to outside from the cell area including the cell area and at least partially overlaps the guard-ring pattern.

19. The method of claim 1, wherein the step f) includes the step of wet etching the insulating layer for patterning with etching solution.

20. The method of claim 19, wherein the etching solution is silicon oxide etchant containing hydrofluoric acid (HF) and buffered oxide etchant (BOE).

21. The method of claim 1, wherein the step g) includes the steps of:
- forming a dielectric layer on the exposed surface of the first electrode node; and
- forming a conductive layer for second electrode on the dielectric layer so that the inside of the first electrode node is filled.

22. The method of claim 21, wherein the dielectric layer is formed of at least one selected from silicon nitride, silicon oxide, and a high dielectric material.

23. The method of claim 22, wherein the high dielectric material is one selected from $Ta_2O_5$, $Al_2O_3$ and PZT, PLZT, and BST as perovskite-family ferroelectric materials.

24. The method of claim 21, wherein the conductive layer for second electrode is conductive polysilicon like as impurity-doped polysilicon.

25. The method of claim 24, wherein the conductive layer for second electrode further includes a barrier layer.

26. The method of claim 1, wherein the step h) includes the steps of:
- forming a photoresist on the conductive layer for second electrode;
- forming a second electrode pattern having a block shape in the photoresist so that a part of the second electrode pattern overlaps partially the peripheral circuit area including the cell area and the guard-ring pattern; and
- etching the conductive layer for second electrode, the dielectric layer and the conductive layer for first electrode remaining in the peripheral circuit area through dry etching using the patterned photoresist as a mask.

27. The method of claim 1, wherein the step i) includes the steps of:
- forming a second ILD film on the entire surface of the semiconductor substrate;
- forming a contact for plate electrode so that the sidewall and the bottom of the second electrode that is formed in the guard-ring pattern are exposed; and
- forming a contact filling conductive layer in the contact for plate electrode so that the sidewall and the bottom of the second electrode are in contact with each other.

28. The method of claim 27, wherein the second ILD film is a silicon oxide layer that is formed through CVD.

29. The method of claim 27, wherein the step of forming a contact for plate electrode includes the steps of:
- forming a photoresist on the second ILD film;
- forming a contact pattern for plate electrode having a block shape in the photoresist to be larger than the actual size in an area where overlaps the guard-ring pattern; and
- dry etching and completely removing the second ILD film in the guard-ring pattern by using the patterned photoresist as a mask and forming a contact for plate electrode so that the sidewall and the bottom of the second electrode in the guard-ring pattern are completely exposed.

30. The method of claim 27, wherein the step of forming a contact fill conductive layer in the contact for plate electrode includes the steps of:
- forming a contact filling conductive layer to be electrically connected to the second electrode on the semiconductor substrate; and
- evenly removing the contact filling conductive layer to the second ILD film.

31. The method of claim 30, wherein the contact filling conductive layer is formed of tungsten (W).

32. The method of claim 31, wherein the contact filling conductive layer further includes Ti and TiN as a barrier layer.

* * * * *